(12) United States Patent
Zhong et al.

(10) Patent No.: US 11,322,528 B2
(45) Date of Patent: May 3, 2022

(54) MANUFACTURING METHOD OF THIN FILM TRANSISTOR PATTERN USING DIFFERENT COLOR MASKS AND MULTILAYER PHOTORESISTS, THIN FILM TRANSISTOR, AND MASK THEREOF

(71) Applicant: TCL CHINA STAR OPTOELECTRONICS TECHNOLOGY CO., LTD., Shenzhen (CN)

(72) Inventors: Shuting Zhong, Shenzhen (CN); Ning Zhang, Shenzhen (CN)

( * ) Notice: Subject to any disclaimer, the term of this patent is extended or adjusted under 35 U.S.C. 154(b) by 178 days.

(21) Appl. No.: 16/647,537

(22) PCT Filed: Jan. 16, 2020

(86) PCT No.: PCT/CN2020/072361
§ 371 (c)(1),
(2) Date: Mar. 16, 2020

(87) PCT Pub. No.: WO2021/128518
PCT Pub. Date: Jul. 1, 2021

(65) Prior Publication Data
US 2022/0005843 A1   Jan. 6, 2022

(30) Foreign Application Priority Data

Dec. 25, 2019   (CN) .......................... 201911354912.8

(51) Int. Cl.
*H01L 27/12*   (2006.01)
*G03F 1/00*   (2012.01)
*G03F 7/20*   (2006.01)

(52) U.S. Cl.
CPC ............ *H01L 27/1288* (2013.01); *G03F 1/00* (2013.01); *G03F 7/2022* (2013.01); *H01L 27/1214* (2013.01)

(58) Field of Classification Search
CPC ... H01L 27/1288; H01L 27/1214; G03F 1/00; G03F 7/2022
See application file for complete search history.

(56) References Cited

FOREIGN PATENT DOCUMENTS

CN            106405964 A   *   2/2017

\* cited by examiner

*Primary Examiner* — John P. Dulka

(57) ABSTRACT

The present disclosure provides a manufacturing method of a TFT pattern, and a mask, which is used to make light pass through a hole corresponding to a position of the TFTs on the mask which is disposed on the TFTs, thereby producing two or more stacked photoresists on the TFTs to counteract a reflected light on a semiconductor As layer and ensure normal working of the TFTs.

12 Claims, 10 Drawing Sheets

MANUFACTURING METHOD OF THIN FILM TRANSISTOR PATTERN USING DIFFERENT COLOR MASKS AND MULTILAYER PHOTORESISTS, THIN FILM TRANSISTOR, AND MASK THEREOF

FIELD OF INVENTION

The present disclosure relates to the field of liquid crystal display technologies, and more particularly, to a manufacturing method of a thin film transistor pattern, a thin film transistor, and a mask.

BACKGROUND OF INVENTION

A mask uses quartz glass as a substrate, and a layer of chromium metal and a photosensitive adhesive are coated thereon to become a photosensitive material. A manufactured circuit pattern is exposed on the photosensitive adhesive using electronic laser equipment, and an exposed area will be developed and form the circuit pattern on the chromium metal to become a mask similar to an exposed film. A production process of a mask is exposing, developing, removing photosensitive adhesives, and at last applying photoetching. Thin film transistors (TFTs) are TFT areas on an array substrate of a thin film transistor liquid crystal display (TFT-LCD). A panel of a TFT-LCD can be viewed as a layer of liquid crystals sandwiched between two glass substrates. The upper layer of glass substrate is a color filter, and the lower layer of glass substrate has transistors mounted on the glass. The upper layer of glass is attached to a color filter to form each pixel containing red, blue, green three colors of sub-pixels. Pixels emitting red, blue, and green colors constitute video pictures of a display panel.

In current known manufacturing method of a TFT pattern, TFTs are covered with a mask, the mask consists of sub-masks covering at least two sets of pixel color blocks, a set of pixel color blocks consists of a red sub-pixel (R), a green sub-pixel (G), and a blue sub-pixel (B) of every column, and the mask consists of 3N numbers of corresponding three types when it is subjected to exposures by an exposure device at adjacent different time points, wherein N≥1. The method comprises following steps:

S1: TFTs being subjected to coating a first photoresist by a spray coating device;

S2: the TFTs being subjected to a first exposure by an exposure device through a first type of mask; wherein in pixel color blocks, the first type has no light-shielding layer on a first column of sub-pixels and has the light-shielding layer on a second column of sub-pixels and a third column of sub-pixels;

S3: the TFTs being subjected to a first development to form a first pattern;

S4: the TFTs being subjected to coating a second photoresist on the first pattern by the spray coating device;

S5: the TFTs being subjected to a second exposure by the exposure device through a second type of mask; wherein the second type has no light-shielding layer on the second column of sub-pixels and has the light-shielding layer on the first column of sub-pixels and the third column of sub-pixels;

S6: the TFTs being subjected to a second development to form a second pattern;

S7: the TFTs being subjected to coating a third photoresist on the second pattern by the spray coating device;

S8: the TFTs being subjected to a third exposure by the exposure device through a third type of mask; wherein the third type has no light-shielding layer on the third column of sub-pixels and has the light-shielding layer on the first column of sub-pixels and the second column of sub-pixels; and S9: the TFTs being subjected to a third development to form a target pattern.

A known mask is shown in FIG. 1 which is a top view of a mask, and FIG. 1 shows a mask 100 covering two sets of pixel color blocks. It can be known from FIG. 1, each set of pixel color blocks covering the mask consists of a red pixel (R), a green pixel (G), and a blue pixel (B) of every column, respectively. A TFT structure of an array substrate shown in FIG. 2 can be obtained by the known mask. FIG. 2 is a schematic cross-sectional diagram of an array substrate 200 corresponding to pixel color blocks. The schematic cross-sectional diagram of the array substrate 200 comprises a cross-sectional view of the TFTs. referring to FIG. 2, the left picture is the array substrate corresponding to a red pixel, the middle picture is the array substrate corresponding to a green pixel, and the right picture is the array substrate corresponding to a blue pixel. Wherein, the array substrate 200 consists of a base substrate 201, a gate electrode layer 202, a first insulating layer 203, a first semiconductor layer 204 (an As layer), a second semiconductor layer 205, a source electrode (Source) 206, a drain electrode (Drain) 207, a red photoresist layer 208R, a planarization layer 209, a pixel layer 210, and an alignment layer 211 marked in the left picture of FIG. 2 in sequence from bottom to top, and the TFTs comprise the gate electrode layer 202, the first insulating layer 203, the first semiconductor layer 204, the second semiconductor layer 205, the source electrode 206, and the drain electrode 207. In addition, the pixel layer 210 is electrically connected to the drain electrode of the TFTs. Layers in the middle picture and the right picture corresponding to those in the left picture are the same as the left picture, which will not be iterated herein for the sake of conciseness, but 208G in the middle picture refers to a green photoresist layer and 208B in the right picture refers to a blue photoresist layer. That is, in the part of the cross-sectional view of the TFTs shown in FIG. 2, the left picture is a cross-sectional view of a TFT area under a red pixel, the middle picture is a cross-sectional view of a TFT area under a green pixel, and the right picture is a cross-sectional view of a TFT area under a blue pixel. There is a TFT area of the array substrate under each column of pixels. FIG. 2 only shows an array substrate structure containing a TFT structure corresponding to a set of pixel color blocks.

However, in a TFT-LCD, a lateral direction of light emitted from the bottom layer of glass substrate to the top layer of glass substrate when lighting would be reflected to the first semiconductor layer (that is the As layer) of the array substrate of the TFT-LCD (as shown in FIG. 2), which generates photogenerated carriers and causes off-state currents $I_{off}$ to increase, so that vertical crosstalk images are produced when lighting the TFT-LCD and original electrical performances of the TFTs are affected.

Technical problem: current technology has a problem of vertical crosstalk images produced when lighting a TFT-LCD.

SUMMARY OF INVENTION

The present disclosure provides a manufacturing method of a TFT pattern. The method comprises:

TFTs being subjected to coating a first photoresist by a spray coating device;

the TFTs being subjected to a first exposure by an exposure device through a first type of mask covering the TFTs; wherein in pixel color blocks, the first type has no light-shielding layer on a first column of sub-pixels and has the light-shielding layer on a second column of sub-pixels and a third column of sub-pixels, and the mask consists of corresponding three types subjected to exposures by the exposure device at adjacent different time points;

the TFTs being subjected to a first development to form a first pattern;

the TFTs being subjected to coating a second photoresist on the first pattern by the spray coating device;

the TFTs being subjected to a second exposure by the exposure device through a second type of mask; wherein the second type has no light-shielding layer on the second column of sub-pixels and has the light-shielding layer on the first column of sub-pixels and the third column of sub-pixels;

the TFTs being subjected to a second development to form a second pattern;

the TFTs being subjected to coating a third photoresist on the second pattern by the spray coating device;

the TFTs being subjected to a third exposure by the exposure device through a third type of mask; wherein the third type has no light-shielding layer on the third column of sub-pixels and has the light-shielding layer on the first column of sub-pixels and the second column of sub-pixels; and the TFTs being subjected to a third development to form a target pattern; wherein in two columns of the light-shielding layer on the sub-pixels of two types among the three types of the mask, at least one column of the light-shielding layer on the sub-pixels is provided with a hole, and a position of the hole corresponds to a position of the TFTs.

The present disclosure provides an array substrate which comprises:

a base substrate;

a photoresist layer covering the TFTs, wherein the photoresist layer consists of at least two different colors of photoresist layers in a stack; and a pixel layer covering the photoresist layer and electrically connected to the drain electrode of the TFTs.

An embodiment of the present disclosure provides a mask. The mask consists of corresponding three types subjected to exposures by an exposure device at adjacent different time points, wherein the three types are respectively:

a first type having no light-shielding layer on a first column of sub-pixels and having the light-shielding layer on a second column of sub-pixels and a third column of sub-pixels when thin film transistors (TFTs) being subjected to a first exposure by the exposure device through the first type of the mask; wherein the first column of sub-pixels, the second column of sub-pixels, and the third column of sub-pixels constitute a set of pixel color blocks;

a second type having no light-shielding layer on the second column of sub-pixels and having the light-shielding layer on the first column of sub-pixels and the third column of sub-pixels when the TFTs being subjected to a second exposure by the exposure device through the second type of the mask; and a third type having no light-shielding layer on the third column of sub-pixels and having the light-shielding layer on the first column of sub-pixels and the second column of sub-pixels when the TFTs being subjected to a third exposure by the exposure device through the third type of the mask; wherein in two columns of the light-shielding layer on the sub-pixels of two types among the three types of the mask, at least one column of the light-shielding layer on the sub-pixels is provided with a hole, and a position of the hole corresponds to a position of the TFTs; wherein the TFTs are TFT areas on a substrate of a thin film transistor liquid crystal display (TFT-LCD) and the TFTs are covered with the mask.

Beneficial effect: the present disclosure can produce two stacked layers of different photoresists on TFTs under each sub-pixel after the TFTs corresponding to each set of pixel color blocks are subjected to three times of exposures in sequence at different time points by changing a manufacturing method of a mask: in two types of three types of the mask, of two columns of the light-shielding layer of the sub-pixels, at least one column of the light-shielding layer of sub-pixels is provided with a hole. That way, due to two stacked photoresists on the TFTs acting as a matting effect against reflected light, the reflected light is almost completely counteracted when the reflected light is reflected from the top layer of glass plate or plastic plate to an As layer of the TFTs, thereby the electrical performances of the TFTs would not be affected and normal working of the TFTs can be ensured.

DETAILED DESCRIPTION OF PREFERRED EMBODIMENTS

An embodiment of the present disclosure provides a manufacturing method of a TFT pattern, an array substrate, and a mask, which is used to make light pass through a hole corresponding to a position of the TFTs on the mask which is disposed on the TFTs, thereby producing two or more stacked photoresists on the TFTs to counteract a reflected light on a semiconductor As layer and ensuring normal working of the TFTs.

As mentioned above, it is known that TFTs are disposed under numerous pixel color blocks, a set of pixel color blocks consists of a red sub-pixel (R), a green sub-pixel (G), and a blue sub-pixel (B) of every column, and a TFT area is disposed under each of sub-pixels. Therefore, how many TFT areas there are on an array substrate of a TFT-LCD can be known by knowing how many pixels there are. It should be noted that, the TFT areas can be disposed at different positions under each sub-pixel, but under each sub-pixel, a TFT area is usually disposed at a position corresponding to upper right of each sub-pixel.

A mask provided by an embodiment of the present disclosure consists of corresponding three types subjected to exposures by an exposure device at adjacent different time points. Wherein, the three types are respectively:

a first type: when the TFTs are subjected to a first exposure by the exposure device through a first type of mask, in each set of pixel color blocks, there is no light-shielding layer on a first column of sub-pixels and there is a light-shielding layer on a second column of sub-pixels and a third column of sub-pixels;

a second type: when the TFTs are subjected to a second exposure by the exposure device through a second type of mask, there is no light-shielding layer on the second column of sub-pixels and there is a light-shielding layer on the first column of sub-pixels and the third column of sub-pixels; and a third type: when the TFTs are subjected to a third exposure by the exposure device through a third type of mask, there is no light-shielding layer on the third column of sub-pixels and there is a light-shielding layer on the first column of sub-pixels and the second column of sub-pixels.

Wherein, in two types of the first type, the second type, and the third type, of two columns of the light-shielding layer of sub-pixels, at least one column of the light-shielding layer of the sub-pixels is provided with a hole, and a position of the hole corresponds to a position of the TFTs.

It should be noted that the first column of sub-pixels, the second column of sub-pixels, and the third column of sub-pixels in the embodiment of the present disclosure have no fixed order, which is not limited herein.

The following describes these three types in turn with reference to the drawings through the embodiments of the present disclosure.

Figure 1:
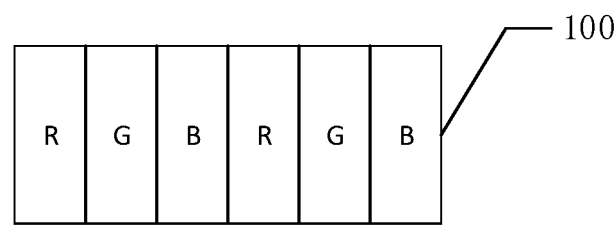
FIG. 1 is a schematic top view of a mask corresponding to pixel color blocks before improving.
Figure 2:
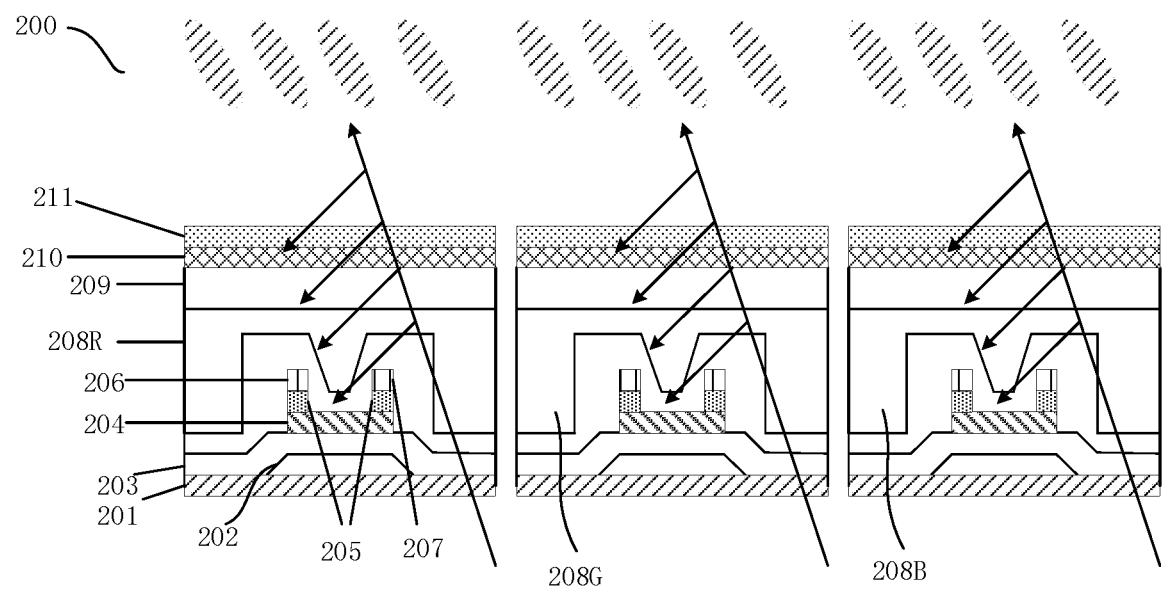
FIG. 2 is a schematic cross-sectional diagram of an array substrate corresponding to pixel color blocks before improving.
Figure 3:
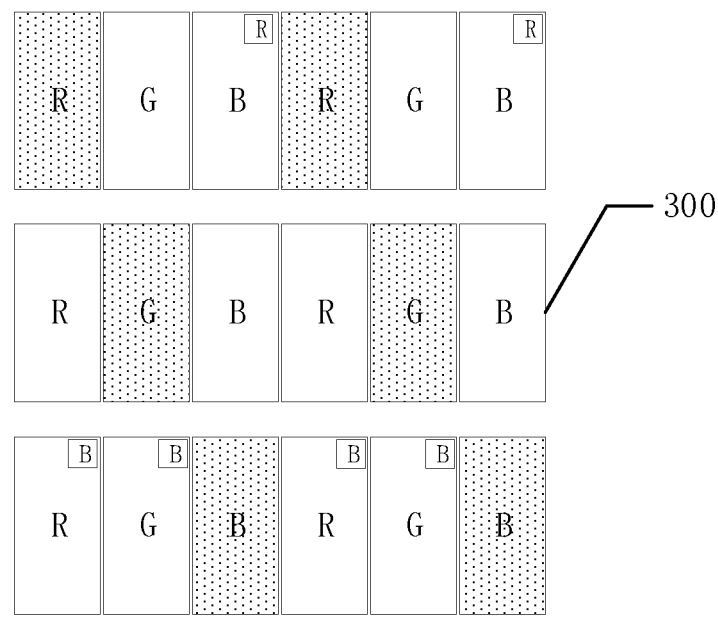
FIG. 3 is a schematic top view of an R/B mask corresponding to pixel color blocks according to an embodiment of the present disclosure.

Referring to FIG. 3, FIG. 3 is a schematic top view of an R/B mask 300 corresponding to pixel color blocks according to an embodiment of the present disclosure.

It should be noted that all the embodiments of the present disclosure use TFT areas corresponding to an upper right position of each pixel as an example for description, but the TFT areas are not limited to dispose at the position.

FIG. 3 only shows a mask 300 on two sets of pixel color blocks.

Wherein, the first type is the upper picture of FIG. 3. From the upper picture, it can be known that the light-shielding layer is disposed on sub-pixels of G and B, and the light-shielding layer on upper right positions of sub-pixels of B is provided with holes. The second type is the middle picture of FIG. 3, the light-shielding layer is disposed on sub-pixels of R and B, and the light-shielding layer on the sub-pixels of R and B has no holes. The third type is the lower picture of FIG. 3, the light-shielding layer is disposed on sub-pixels of R and G, and the light-shielding layer on upper right positions of the sub-pixels of R and G is provided with holes.

The above is the description of the R/B mask corresponding to the pixel color blocks according to the embodiment of the present disclosure, and a technical effect thereof will be described in detail in the following which is about a manufacturing method of a TFT pattern.

Figure 6:
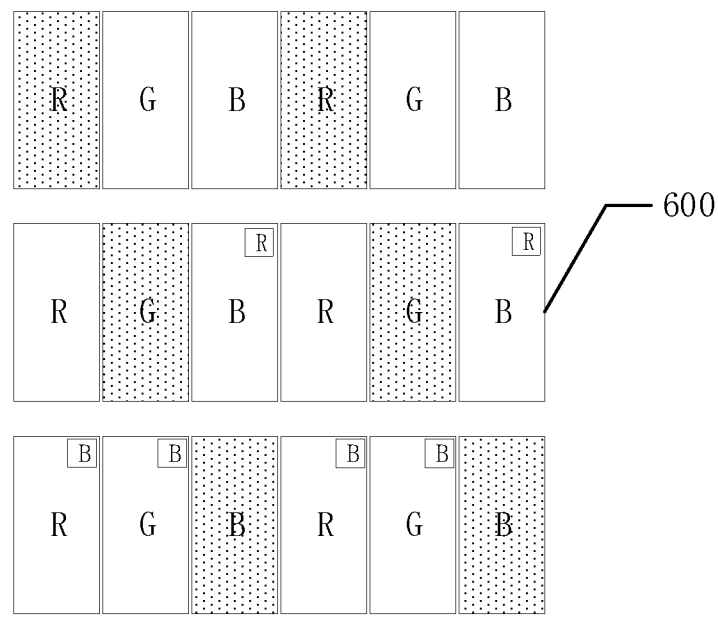
FIG. 6 is a schematic top view of a G/B mask corresponding to pixel color blocks according to an embodiment of the present disclosure.

Referring to FIG. 6, FIG. 6 is a schematic top view of a G/B mask 600 corresponding to pixel color blocks according to an embodiment of the present disclosure.

As shown in FIG. 6, the first type is the upper picture of FIG. 6. The light-shielding layer is disposed on sub-pixels of G and B, and the light-shielding layer on the sub-pixels of G and B has no holes. The second type is the middle picture of FIG. 6, the light-shielding layer is disposed on sub-pixels of R and B, and the light-shielding layer on upper right positions of the sub-pixels of B is provided with holes. The third type is the lower picture of FIG. 6, the light-shielding layer is disposed on sub-pixels of R and G, and the light-shielding layer on upper right positions of the sub-pixels of R and G is provided with holes.

Figure 9:
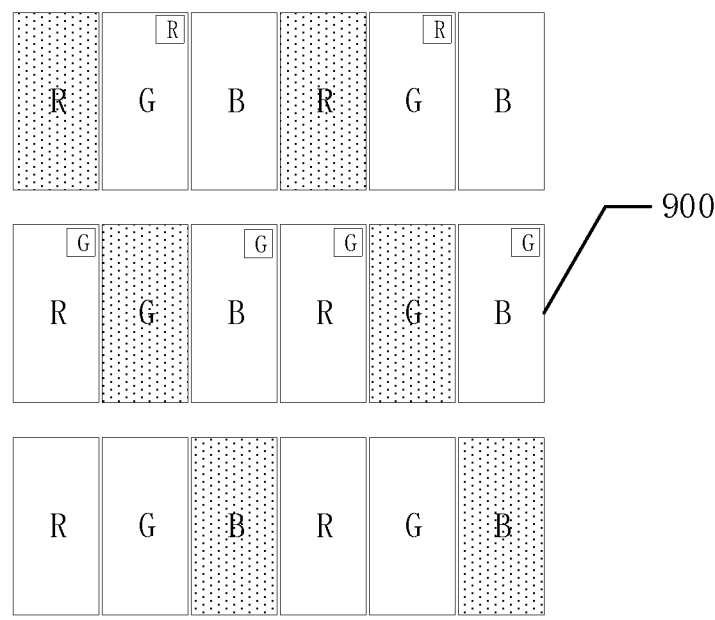
FIG. 9 is a schematic top view of an R/G mask corresponding to pixel color blocks according to an embodiment of the present disclosure.

Referring to FIG. 9, FIG. 9 is a schematic top view of an R/G mask 900 corresponding to pixel color blocks according to an embodiment of the present disclosure.

As shown in FIG. 9, the first type is the upper picture of FIG. 9. The light-shielding layer is disposed on sub-pixels of G and B, and the light-shielding layer on upper right positions of the sub-pixels of G is provided with holes. The second type is the middle picture of FIG. 9, the light-shielding layer is disposed on sub-pixels of R and B, and the light-shielding layer on upper right positions of the sub-pixels of R and B is provided with holes. The third type is the lower picture of FIG. 9, the light-shielding layer is disposed on sub-pixels of R and G, and the light-shielding layer on the sub-pixels of R and G has no holes.

Figure 12:
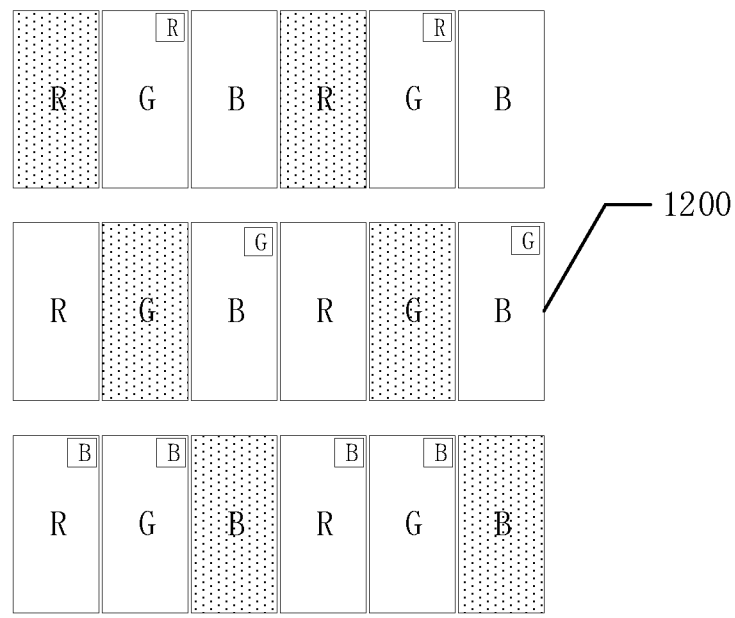
FIG. 12 is a schematic top view of an R/G/B mask corresponding to pixel color blocks according to an embodiment of the present disclosure.

At last, referring to FIG. 12, FIG. 12 is a schematic top view of an R/G/B mask 1200 corresponding to pixel color blocks according to an embodiment of the present disclosure, and it is also a schematic diagram of the R/G/B mask according to an embodiment of the present disclosure.

As shown in FIG. 12, the first type is the upper picture of FIG. 12. The light-shielding layer is disposed on sub-pixels of G and B, and the light-shielding layer on upper right positions of the sub-pixels of G is provided with holes. The second type is the middle picture of FIG. 12, the light-shielding layer is disposed on sub-pixels of R and B, and the light-shielding layer on upper right positions of the sub-pixels of B is provided with holes. The third type is the lower picture of FIG. 12, the light-shielding layer is disposed on sub-pixels of R and G, and the light-shielding layer on upper right positions of the sub-pixels of R and G is provided with holes.

The mask types in each embodiment of the present disclosure have been described above. Based on the mask types in each above embodiment, each embodiment of a manufacturing method of a TFT pattern is described in detail below.

Figure 4:
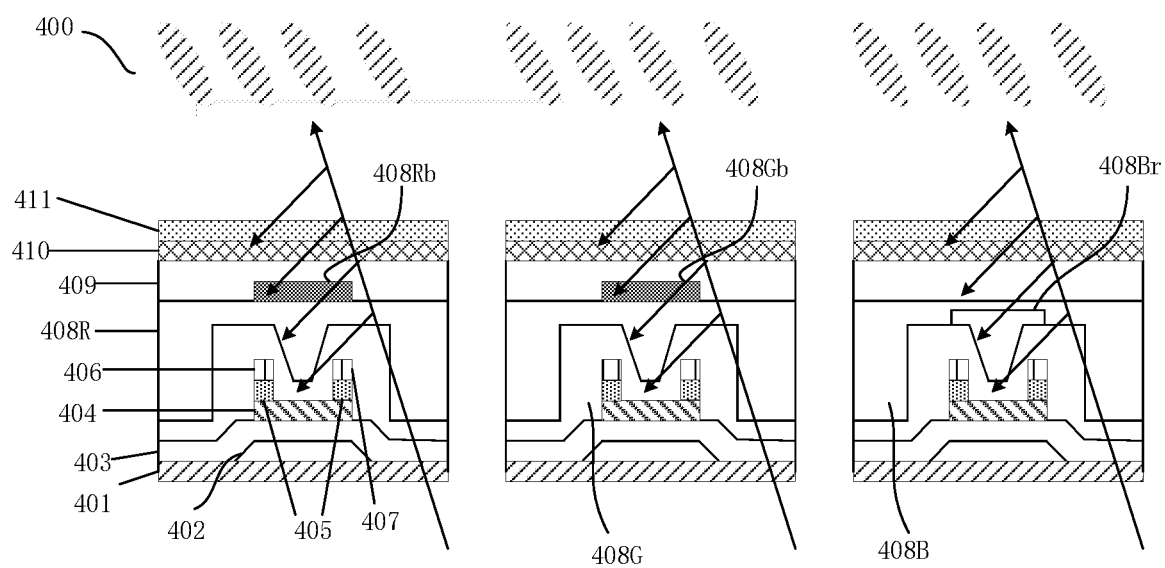
FIG. 4 is a schematic cross-sectional diagram of an array substrate corresponding to an R/B mask according to an embodiment of the present disclosure.
Figure 5:
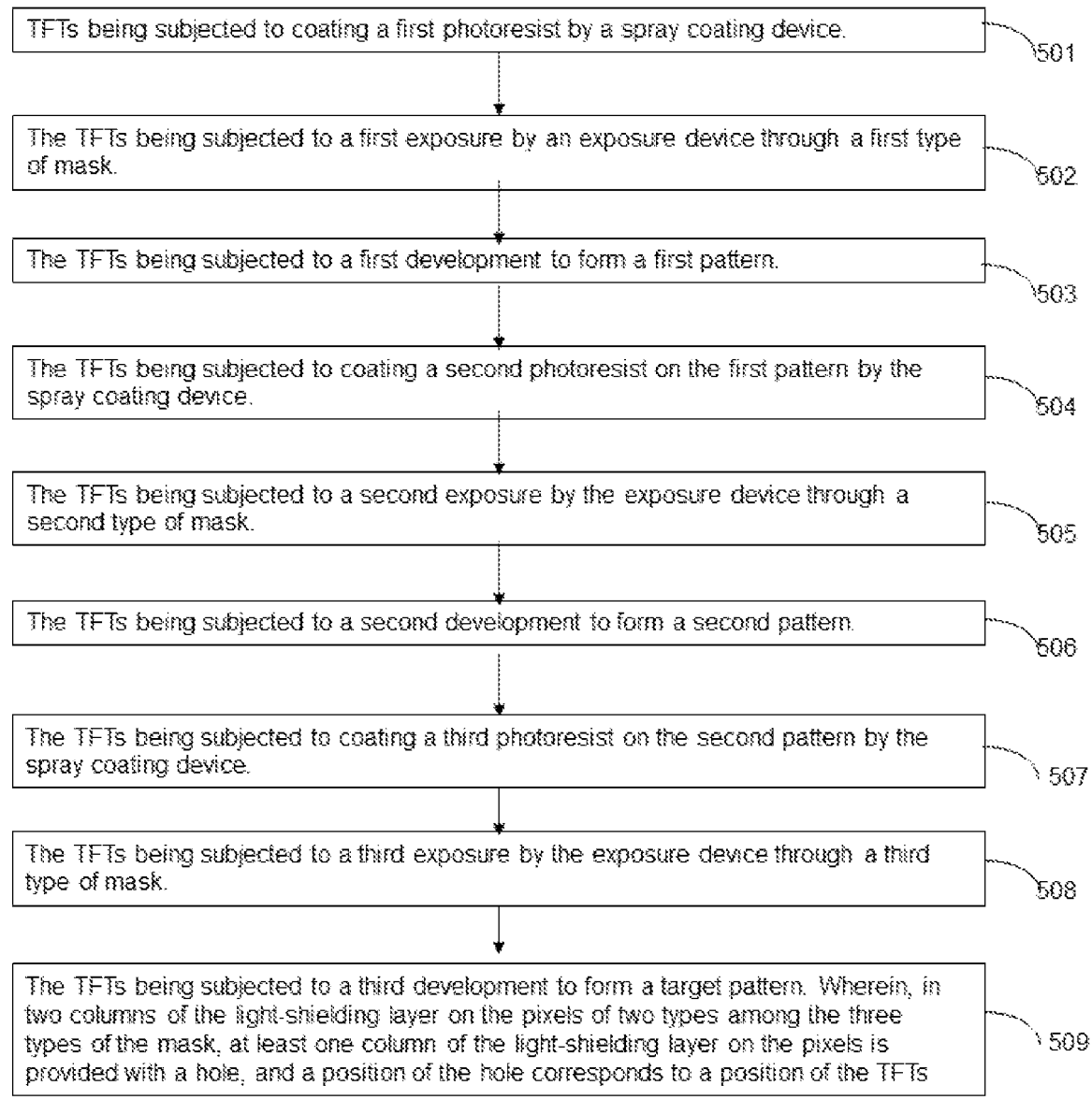
FIG. 5 is a flowchart of a manufacturing method of a TFT pattern by an R/B mask according to an embodiment of the present disclosure.

Referring to FIG. 4 and FIG. 5, FIG. 4 is a schematic cross-sectional diagram of an array substrate 400 corresponding to the R/B mask according to an embodiment of the present disclosure, and FIG. 5 is a flowchart of a manufacturing method of a TFT pattern by the R/B mask according to an embodiment of the present disclosure.

Based on FIG. 3 and the description of the R/B mask, the cross-sectional diagram of the array substrate 400 containing TFTs corresponding to the R/B mask in FIG. 4 can be manufactured by three consecutive exposures on each set of pixel color blocks at different time points. It should be noted that in the part of the cross-sectional view of the TFTs of the array substrate 400 shown in FIG. 4, the left picture is a cross-sectional view of a TFT area under a red pixel, which corresponds to the mask type of the upper picture in FIG. 3. The middle picture is a cross-sectional view of a TFT area under a green pixel, which corresponds to the mask type of the middle picture in FIG. 3. The right picture is a cross-sectional view of a TFT area under a blue pixel, which corresponds to the mask type of the lower picture in FIG. 3. Wherein, the array substrate 400 consists of a base substrate 401, a gate electrode layer 402, a first insulating layer 403, a first semiconductor layer 404 (an As layer), a second semiconductor layer 405, a source electrode 406, a drain electrode 407, a red photoresist layer 408R, a blue photoresist layer 408Rb, a planarization layer 409, a pixel layer 410, and an alignment layer 411 marked in the left picture of FIG. 4 in sequence from bottom to top, and a TFT comprises the gate electrode layer 402, the first insulating layer 403, the first semiconductor layer 404, the second semiconductor layer 405, the source electrode 406, and the drain electrode 407. In addition, the pixel layer 410 is electrically connected to the drain electrode of the TFT. Layers in the middle picture and the right picture corresponding to those in the left picture are the same as the left picture, which will not be iterated herein for the sake of conciseness, but 408G in the middle picture refers to a green photoresist layer and 408Gb is a blue photoresist layer covering the green photoresist layer; and 408B in the right picture refers to a blue photoresist layer and 408Br is a red photoresist layer covering the blue photoresist layer. In the part of the cross-sectional view of the TFTs shown in FIG. 4, the left picture is a cross-sectional view of a TFT area under a red pixel, the middle picture is a cross-sectional view of a TFT area under a green pixel, and the right picture is a cross-sectional view of a TFT area under a blue pixel. There is a TFT area under each column of pixels. FIG. 4 only shows an array substrate structure containing a TFT structure corresponding to a set of pixel color blocks.

It should be noted that although FIG. 4 of the embodiment shows the alignment layer 411, the alignment layer 411 can also not be disposed in the array substrate, which is not limited herein.

As described above, TFTs are TFT areas on the array substrate of a TFT-LCD, the TFTs are covered with a mask, and the mask consists of corresponding three types subjected to exposures by an exposure device at adjacent different time points.

An embodiment of a manufacturing method of a TFT pattern based on the R/B mask has following steps:

step 501: TFTs being subjected to coating a first photoresist by a spray coating device.

In the embodiment, the first photoresist can be a red photoresist, which is referred to as an R photoresist hereinafter.

Step 502: the TFTs being subjected to a first exposure by an exposure device through a first type of mask; wherein, in pixel color blocks, the first type has no light-shielding layer on a first column of sub-pixels and has the light-shielding layer on a second column of sub-pixels and a third column of sub-pixels. In the embodiment, the first column of sub-pixels, the second column of sub-pixels, and the third column of sub-pixels constitute a set of pixel color blocks, and the cross-sectional view of TFTs in FIG. 4 is obtained by three times of exposures based on the R/B mask. Referring to FIG. 4, in the first type of the embodiment, the first column of sub-pixels is an R pixel and there is no light-shielding layer on it; the second column of sub-pixels is a G pixel, the third column of sub-pixels is a B pixel, and there is a light-shielding layer on the G pixel and the B pixel.

In addition, the light-shielding layer corresponding to an upper right position of the B pixel is provided with a hole.

Step 503: the TFTs being subjected to a first development to form a first pattern.

In the embodiment, after a TFT under the R pixel is subjected to the first development, a layer of R photoresist will be formed on the TFT because there is no light-shielding layer on the R pixel during the first exposure, and because there is a light-shielding layer on the G pixel during the first exposure, a pattern of R photoresist will not be formed on the TFT under the G pixel. In addition, because there is a light-shielding layer on the B pixel during the first exposure and the light-shielding layer corresponding to the upper right position of the B pixel is provided with the hole, a pattern of a layer of R photoresist will be formed on the TFT under the B pixel.

It should be noted that the position provided with the hole on the light-shielding layer of the mask can use a grayscale mask design or a slit mask design, and both of the two designs can obtain the cross-sectional diagram of the array substrate containing TFTs in FIG. 4. The mask design used for the mask is not limited herein.

The embodiment uses the grayscale mask design, so the position of the TFT under the small hole receives a weaker light due to grayscales. Therefore, a thinner layer of R photoresist can be formed on the TFT under the B pixel.

That way, a photoresist pattern formed on the three TFTs under the three columns of pixels after the first exposure constitutes the first pattern.

Step 504: the TFTs being subjected to coating a second photoresist on the first pattern by the spray coating device.

Next, the second photoresist is coated on the first pattern on the TFTs by the spray coating device, and the second photoresist in the embodiment is green.

Step 505: the TFTs being subjected to a second exposure by the exposure device through a second type of mask; wherein the second type has no light-shielding layer on the second column of sub-pixels and has the light-shielding layer on the first column of sub-pixels and the third column of sub-pixels.

In the embodiment, the second type has no light-shielding layer on the G pixel and has the light-shielding layer on the R pixel and the B pixel.

Step 506: the TFTs being subjected to a second development to form a second pattern.

In the embodiment, after the TFT under the R pixel is subjected to the second development, a pattern of G photoresist will not be formed on the pattern of the R photoresist on the TFT and only the pattern of the R photoresist is retained because there is a light-shielding layer on the R pixel during the second exposure; and because there is no light-shielding layer on the G pixel during the second exposure, a pattern of a layer of G photoresist will be formed on the TFT under the G pixel. In addition, because there is a light-shielding layer on the B pixel during the second exposure, a pattern of G photoresist will not be formed on the pattern of the R photoresist on the TFT under the B pixel and only the pattern of the thinner layer of the R photoresist is retained.

That way, a photoresist pattern formed on the three TFTs under the three columns of pixels after the second exposure constitutes the second pattern.

Step 507: the TFTs being subjected to coating a third photoresist on the second pattern by the spray coating device.

Next, the third photoresist is coated on the second pattern on the TFTs by the spray coating device, and the third photoresist in the embodiment is blue.

Step 508: the TFTs being subjected to a third exposure by the exposure device through a third type of mask; wherein the third type has no light-shielding layer on the third column of sub-pixels and has the light-shielding layer on the first column of sub-pixels and the second column of sub-pixels.

In the embodiment, the third type has no light-shielding layer on the B pixel and has the light-shielding layer on the R pixel and the G pixel.

Step 509: the TFTs being subjected to a third development to form a target pattern. Wherein, in two columns of the light-shielding layer on the pixels of two types among the three types of the mask, at least one column of the light-shielding layer on the pixels is provided with a hole, and a position of the hole corresponds to a position of the TFTs.

In the embodiment, as described above, the upper right position of the light-shielding layer on the B pixel of the first type and the upper right positions of the light-shielding layer on the R pixel and the G pixel of the third type are provided with holes.

In the embodiment, after the TFT under the R pixel is subjected to the third development, a pattern of a layer of B photoresist will be formed on the pattern of the R photoresist because the upper right position of the light-shielding layer on the R pixel is provided with a hole during the third exposure. Similarly, because the upper right position of the light-shielding layer on the G pixel is provided with a hole, a pattern of a layer of B photoresist will be formed on the pattern of the G photoresist. In addition, because there is no light-shielding layer on the B pixel, a pattern of a layer of B photoresist will be formed on the pattern of the R photoresist on the TFT under the B pixel.

The embodiment uses the grayscale mask design, so the position of the TFT under the small hole receives a weaker light due to grayscales. Therefore, a pattern of a thinner layer of B photoresist can be formed on the TFT under the B pixel.

That way, a photoresist pattern formed on the three TFTs under the three columns of pixels after the third exposure constitutes the target pattern.

From the target pattern, it can be known that there are two photoresists stacked on the TFTs under each column of pixels. That way, when light emits to the top layer of glass plate of the TFT-LCD, the light will be reflected to the semiconductor As layer of the TFTs, but due to two stacked photoresists formed on the TFTs, the reflected light can be counteracted, thereby acting as a matting effect.

Based on the above description, The embodiment can produce two stacked layers of different photoresists on TFTs under each pixel after the TFTs corresponding to each set of pixel color blocks are subjected to three times of exposures in sequence at different time points by changing the manufacturing method of the mask: disposing holes on the upper right position of the light-shielding layer on the B pixel of the first type and the upper right positions of the light-shielding layer on the R pixel and the G pixel of the third type. That way, due to two stacked photoresists on the TFTs acting as a matting effect against reflected light, the reflected light is almost completely counteracted when the reflected light is reflected from the top layer of glass plate to the As layer of the TFTs, thereby the electrical performances of the TFTs would not be affected and normal working of the TFTs can be ensured.

The above is the embodiment of the manufacturing method of the TFT pattern based on the R/B mask. Referring from FIG. 6 to FIG. 8 in the following, FIG. 6 is a schematic top view of a G/B mask corresponding to pixel color blocks according to an embodiment of the present disclosure, FIG. 7 is a schematic cross-sectional diagram of an array substrate corresponding to a G/B mask according to an embodiment of the present disclosure, and FIG. 8 is a flowchart of a manufacturing method of a TFT pattern by a G/B mask according to an embodiment of the present disclosure.

Figure 7:
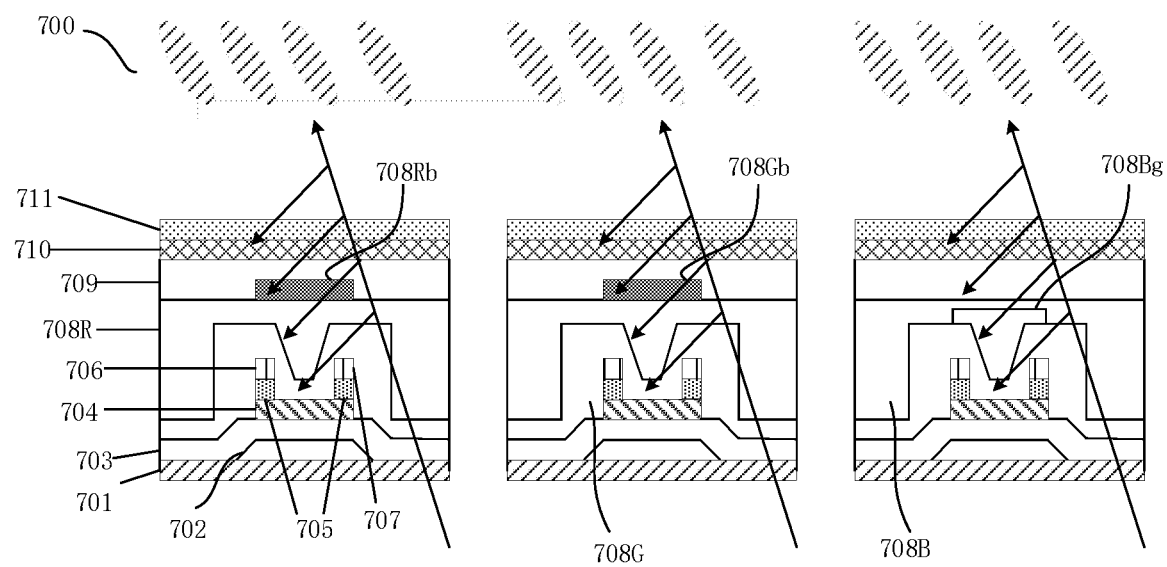
FIG. 7 is a schematic cross-sectional diagram of an array substrate corresponding to a G/B mask according to an embodiment of the present disclosure.
Figure 8:
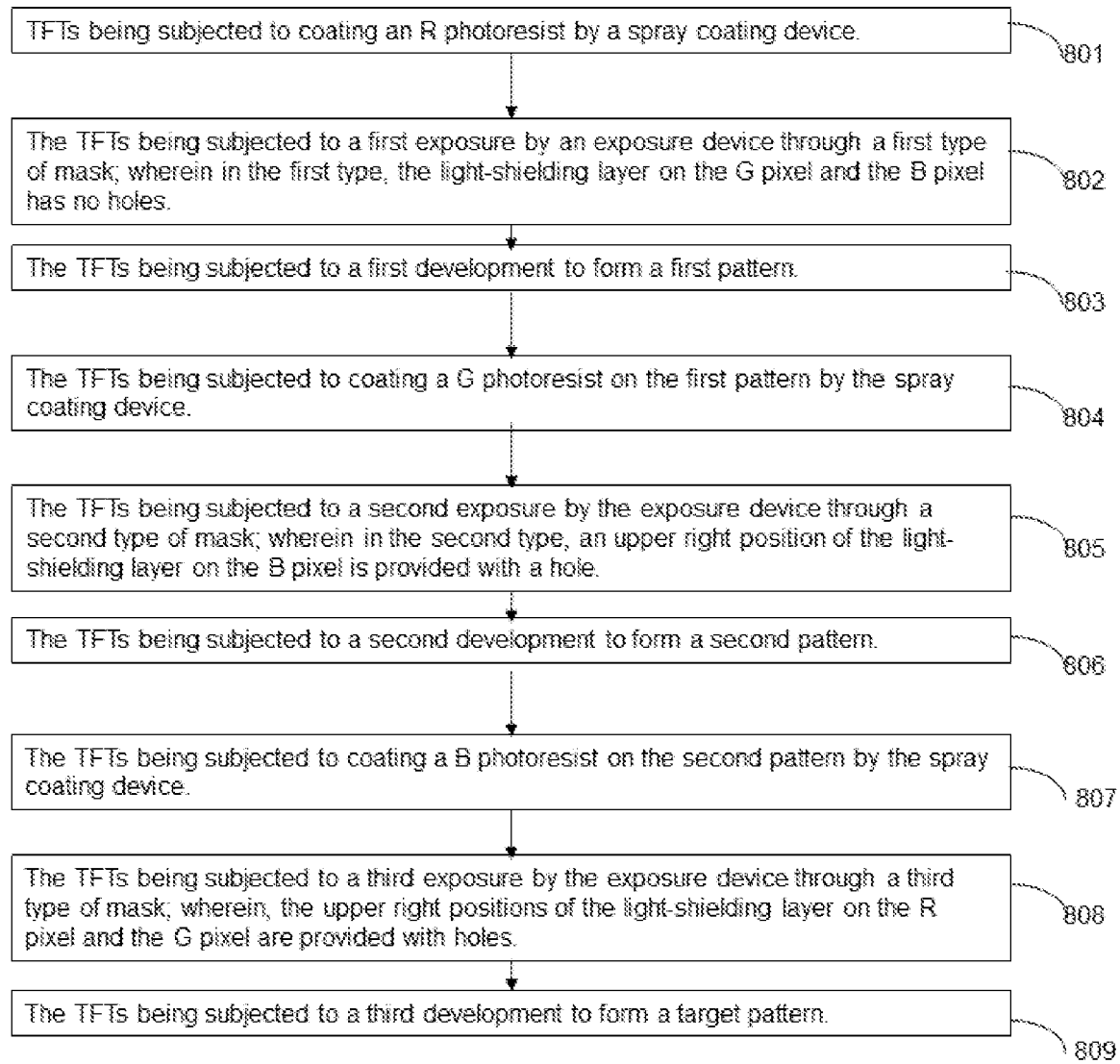
FIG. 8 is a flowchart of a manufacturing method of a TFT pattern by a G/B mask according to an embodiment of the present disclosure.

Based on FIG. 6 and the description of the G/B mask, the cross-sectional diagram of the array substrate 700 containing TFTs corresponding to the G/B mask in FIG. 7 can be manufactured by three consecutive exposures on each set of pixel color blocks at different time points. Wherein, in the part of the cross-sectional view of the TFTs of the array substrate 700 shown in FIG. 7, the left picture is a cross-sectional view of a TFT area under a red pixel, which corresponds to the mask type of the upper picture in FIG. 5. The middle picture is a cross-sectional view of a TFT area under a green pixel, which corresponds to the mask type of the middle picture in FIG. 5. The right picture is a cross-sectional view of a TFT area under a blue pixel, which corresponds to the mask type of the lower picture in FIG. 5. Wherein, the array substrate 700 consists of a base substrate 701, a gate electrode layer 702, a first insulating layer 703, a first semiconductor layer 704, a second semiconductor layer 705, a source electrode 706, a drain electrode 707, a red photoresist layer 708R, a blue photoresist layer 708Rb, a planarization layer 709, a pixel layer 710, and an alignment layer 711 marked in the left picture of FIG. 7 in sequence from bottom to top. In addition, the pixel layer 710 is electrically connected to the drain electrode of the TFT. Layers in the middle picture and the right picture corresponding to those in the left picture are the same as the left picture, which will not be iterated herein for the sake of conciseness, but 708G in the middle picture refers to a G photoresist layer and 708Gb is a B photoresist layer; and 708B in the right picture refers to a B photoresist layer and 708Bg is a G photoresist layer covering the B photoresist layer. In the part of the cross-sectional view of the TFTs shown in FIG. 7, the left picture is a cross-sectional view of a TFT area under the a pixel, the middle picture is a cross-sectional view of a TFT area under a G pixel, and the right picture is a cross-sectional view of a TFT area under a B pixel. There is a TFT area under each column of pixels.

It should be noted that although FIG. 7 of the embodiment shows the alignment layer 711, the alignment layer 711 can also not be disposed in the array substrate, which is not limited herein.

An embodiment of a manufacturing method of a TFT pattern based on the G/B mask has following steps:

step 801: TFTs being subjected to coating an R photoresist by a spray coating device.

Step 802: the TFTs being subjected to a first exposure by an exposure device through a first type of mask; wherein in the first type, the light-shielding layer on the G pixel and the B pixel has no holes.

In the embodiment, in pixel color blocks, the first type has no light-shielding layer on the R pixel and has a light-shielding layer on the G pixel and the B pixel, and in the first type, the light-shielding layer on the G pixel and the B pixel has no holes.

Step 803: the TFTs being subjected to a first development to form a first pattern.

In the embodiment, after a TFT under the R pixel is subjected to the first development, a pattern of a layer of R photoresist will be formed on the TFT because there is no light-shielding layer on the R pixel during the first exposure, and because there is a light-shielding layer on the G pixel and the B pixel during the first exposure, a pattern of R photoresist will not be formed on the TFTs under the G pixel and the B pixel.

That way, a photoresist pattern formed on the three TFTs under the three columns of pixels after the first exposure constitutes the first pattern.

Step 804: the TFTs being subjected to coating a G photoresist on the first pattern by the spray coating device.

Step 805: the TFTs being subjected to a second exposure by the exposure device through a second type of mask; wherein in the second type, an upper right position of the light-shielding layer on the B pixel is provided with a hole.

In the embodiment, in pixel color blocks, the second type has no light-shielding layer on the G pixel and has a light-shielding layer on the R pixel and the B pixel, and in the second type, the upper right position of the light-shielding layer on the B pixel is provided with the hole.

Step 806: the TFTs being subjected to a second development to form a second pattern.

In the embodiment, after the TFT under the R pixel is subjected to the second development, a pattern of G photoresist will not be formed on the pattern of the R photoresist on the TFT and only the pattern of the R photoresist is retained because there is a light-shielding layer on the R pixel during the second exposure; and because there is no light-shielding layer on the G pixel during the second exposure, a pattern of a layer of G photoresist will be formed on the TFT under the G pixel. In addition, although there is a light-shielding layer on the B pixel during the second exposure, a pattern of a thinner layer of G photoresist will be formed on the TFT under the B pixel due to the upper right position of the light-shielding layer is provided with a hole.

That way, a photoresist pattern formed on the three TFTs under the three columns of pixels after the second exposure constitutes the second pattern.

Step 807: the TFTs being subjected to coating a B photoresist on the second pattern by the spray coating device.

Next, the B photoresist is coated on the second pattern on the TFTs by the spray coating device.

Step 808: the TFTs being subjected to a third exposure by the exposure device through a third type of mask; wherein, the upper right positions of the light-shielding layer on the R pixel and the G pixel are provided with holes.

In the embodiment, the third type has no light-shielding layer on the B pixel and has the light-shielding layer on the R pixel and the G pixel. In addition, the upper right positions of the light-shielding layer on the R pixel and the G pixel are provided with holes.

Step 809: the TFTs being subjected to a third development to form a target pattern.

In the embodiment, after the TFT under the R pixel is subjected to the third development, a pattern of a layer of B photoresist will be formed on the pattern of the R photoresist because the upper right position of the light-shielding layer on the R pixel is provided with a hole during the third exposure. Similarly, because the upper right position of the light-shielding layer on the G pixel is provided with a hole, a pattern of a layer of B photoresist will be formed on the pattern of the G photoresist. In addition, because there is no light-shielding layer on the B pixel, a pattern of a layer of B photoresist will be formed on the pattern of the G photoresist on the TFT under the B pixel.

That way, a photoresist pattern formed on the three TFTs under the three columns of pixels after the third exposure constitutes the target pattern.

Similarly, from the target pattern, it can be known that there are two photoresists stacked on the TFTs under each column of pixels.

The embodiment can produce two stacked layers of different photoresists on TFTs under each pixel after the TFTs corresponding to each set of pixel color blocks are subjected to three times of exposures in sequence at different time points by disposing holes on the upper right position of the light-shielding layer on the B pixel of the first type and the upper right positions of the light-shielding layer on the R pixel and the G pixel of the third type. By this way, a matting effect against a reflected light reflected to the semiconductor As layer can work, thereby ensuring normal working of the TFTs.

The above is the embodiment of the manufacturing method of the TFT pattern based on the G/B mask. Referring from FIG. 9 to FIG. 11 in the following, FIG. 9 is a schematic top view of a R/G mask corresponding to pixel color blocks according to an embodiment of the present disclosure, FIG. 10 is a schematic cross-sectional diagram of an array substrate 1000 corresponding to the R/G mask according to an embodiment of the present disclosure, and FIG. 11 is a flowchart of a manufacturing method of a TFT pattern by the R/G mask according to an embodiment of the present disclosure.

Figure 10:
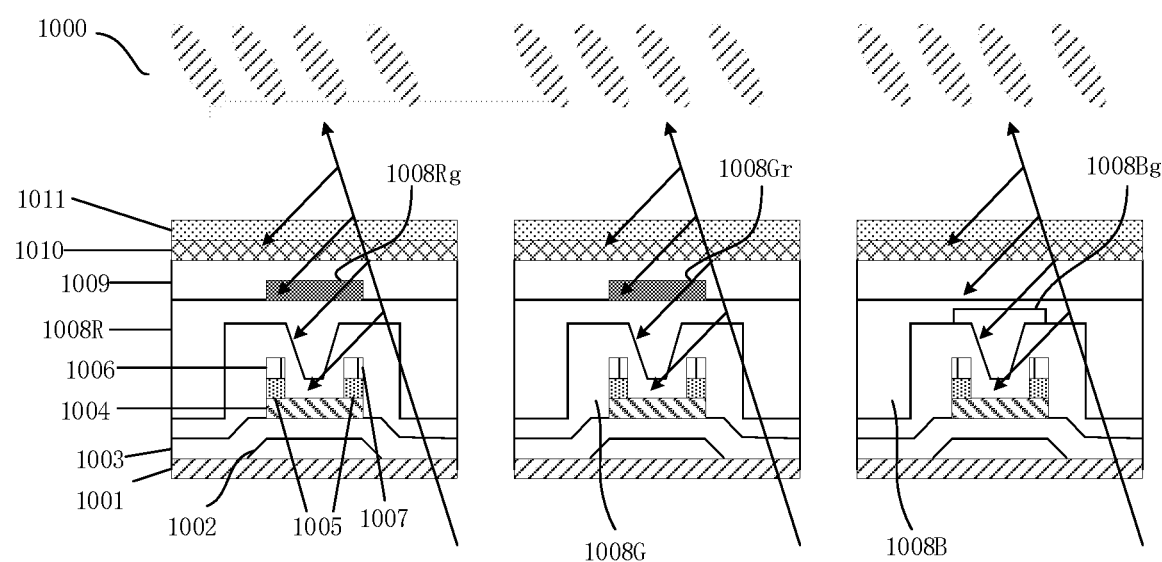
FIG. 10 is a schematic cross-sectional diagram of an array substrate corresponding to an R/G mask according to an embodiment of the present disclosure.

Based on FIG. 9 and the description of the R/G mask, the cross-sectional diagram of the array substrate 1000 containing TFTs corresponding to the R/G mask in FIG. 10 can be manufactured by three consecutive exposures on each set of pixel color blocks at different time points. It should be noted that in the part of the cross-sectional view of the TFTs of the array substrate 1000 shown in FIG. 10, the left picture is a cross-sectional view of a TFT area under a red pixel, which corresponds to the mask type of the upper picture in FIG. 9. The middle picture is a cross-sectional view of a TFT area under a green pixel, which corresponds to the mask type of the middle picture in FIG. 9. The right picture is a cross-sectional view of a TFT area under a blue pixel, which corresponds to the mask type of the lower picture in FIG. 9. Wherein, the array substrate 1000 consists of a base substrate 1001, a gate electrode layer 1002, a first insulating layer 1003, a first semiconductor layer 1004 (an As layer), a second semiconductor layer 1005, a source electrode 1006, a drain electrode 1007, an R photoresist layer 1008R, a G photoresist layer 1008Rg, a planarization layer 1009, a pixel layer 1010, and an alignment layer 1011 marked in the left picture of FIG. 10 in sequence from bottom to top, and a TFT comprises the gate electrode layer 1002, the first insulating layer 1003, the first semiconductor layer 1004, the second semiconductor layer 1005, the source electrode 1006, and the drain electrode 1007. In addition, the pixel layer 1010 is electrically connected to the drain electrode of the TFT. Layers in the middle picture and the right picture corresponding to those in the left picture are the same as the left picture, which will not be iterated herein for the sake of conciseness, but 1008G in the middle picture refers to a G photoresist layer and 1008Gr is an R photoresist layer covering the G photoresist layer; and 1008B in the right picture refers to a B photoresist layer and 1008Bg is a G photoresist layer covering the B photoresist layer. In the part of the cross-sectional view of the TFTs shown in FIG. 10, the left picture is a cross-sectional view of a TFT area under a red pixel, the middle picture is a cross-sectional view of a TFT area under a green pixel, and the right picture is a cross-sectional view of a TFT area under a blue pixel. There is a TFT area under each column of pixels.

It should be noted that although FIG. 10 of the embodiment shows the alignment layer 1011, the alignment layer 1011 can also not be disposed in the array substrate, which is not limited herein.

Figure 11:
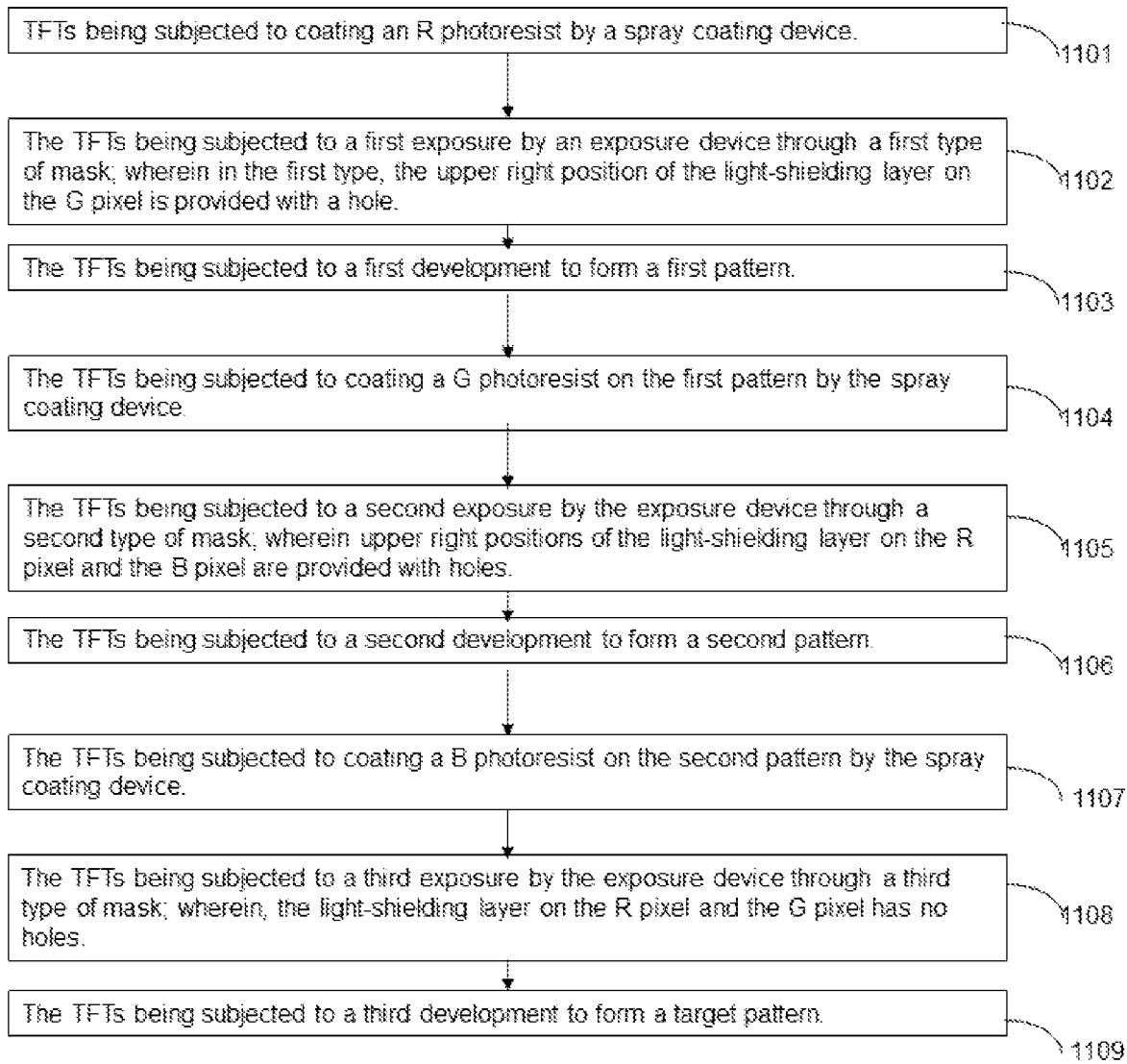
FIG. 11 is a flowchart of a manufacturing method of a TFT pattern by an R/G mask according to an embodiment of the present disclosure.

Referring to FIG. 11, the mask in the embodiment is described above (as shown in FIG. 9). An embodiment of a manufacturing method of a TFT pattern based on the R/G mask has following steps:

step 1001: TFTs being subjected to coating an R photoresist by a spray coating device.

Step 1102: the TFTs being subjected to a first exposure by an exposure device through a first type of mask; wherein in the first type, the upper right position of the light-shielding layer on the G pixel is provided with a hole.

In the embodiment, in pixel color blocks, the first type has no light-shielding layer on the R pixel and has a light-shielding layer on the G pixel and the B pixel, and the upper right position of the light-shielding layer on the G pixel is provided with a hole.

Step 1103: the TFTs being subjected to a first development to form a first pattern.

In the embodiment, after a TFT under the R pixel is subjected to the first development, a pattern of a layer of R photoresist will be formed on the TFT under the R pixel; because the upper right position of the light-shielding layer on the G pixel is provided with a hole, a pattern of a thinner layer of R photoresist will be formed on the TFT under the G pixel; and because there is a light-shielding layer on the B pixel, a pattern of R photoresist will not be formed under the B pixel.

That way, a photoresist pattern formed on the three TFTs under the three columns of pixels after the first exposure constitutes the first pattern.

Step 1104: the TFTs being subjected to coating a G photoresist on the first pattern by the spray coating device.

Step 1105: the TFTs being subjected to a second exposure by the exposure device through a second type of mask; wherein upper right positions of the light-shielding layer on the R pixel and the B pixel are provided with holes.

In the embodiment, in pixel color blocks, the second type has no light-shielding layer on the G pixel and has a light-shielding layer on the R pixel and the B pixel, and the upper right positions of the light-shielding layer on the R pixel and the B pixel are provided with the holes.

Step 1106: the TFTs being subjected to a second development to form a second pattern.

In the embodiment, after the TFT under the R pixel is subjected to the second development, a pattern of a thinner layer of G photoresist will be formed on the pattern of the R photoresist on the TFT, a pattern of a layer of G photoresist will be formed on the pattern of the R photoresist on the TFT under the G pixel, and a pattern of a thinner layer of G photoresist will be formed on the TFT under the B pixel.

That way, a photoresist pattern formed on the three TFTs under the three columns of pixels after the second exposure constitutes the second pattern.

Step 1107: the TFTs being subjected to coating a B photoresist on the second pattern by the spray coating device.

Step 1108: the TFTs being subjected to a third exposure by the exposure device through a third type of mask; wherein, the light-shielding layer on the R pixel and the G pixel has no holes.

In the embodiment, the third type has no light-shielding layer on the B pixel and has the light-shielding layer on the R pixel and the G pixel. The light-shielding layer on the R pixel and the G pixel has no holes.

Step 1109: the TFTs being subjected to a third development to form a target pattern.

In the embodiment, after the TFT under the R pixel is subjected to the third development, a pattern of a layer of B photoresist will not be formed on the pattern of the G photoresist on the TFT under the R pixel. Similarly, a pattern of a layer of B photoresist will not be formed on the pattern of the G photoresist on the TFT under the G pixel, either, and a pattern of a layer of B photoresist will be formed on the pattern of the G photoresist on the TFT under the B pixel.

That way, a photoresist pattern formed on the three TFTs under the three columns of pixels after the third exposure constitutes the target pattern.

In the embodiment, because there are two layers of photoresists stacked on the TFTs under each column of pixels after three times of exposures, the reflected light reflected from the top layer of glass plate to the semiconductor As layer can be counteracted similarly, thereby ensuring normal working of the TFTs.

From the above embodiments, it can be known that the TFTs in the embodiment of the present disclosure comprise a substrate and a photoresist layer. Wherein, the photoresist layer consists of at least two different colors of photoresist layers and covers the TFT substrate.

The above is the embodiment of the manufacturing method of the TFT pattern by the R/G mask according to the present disclosure.

Figure 13:
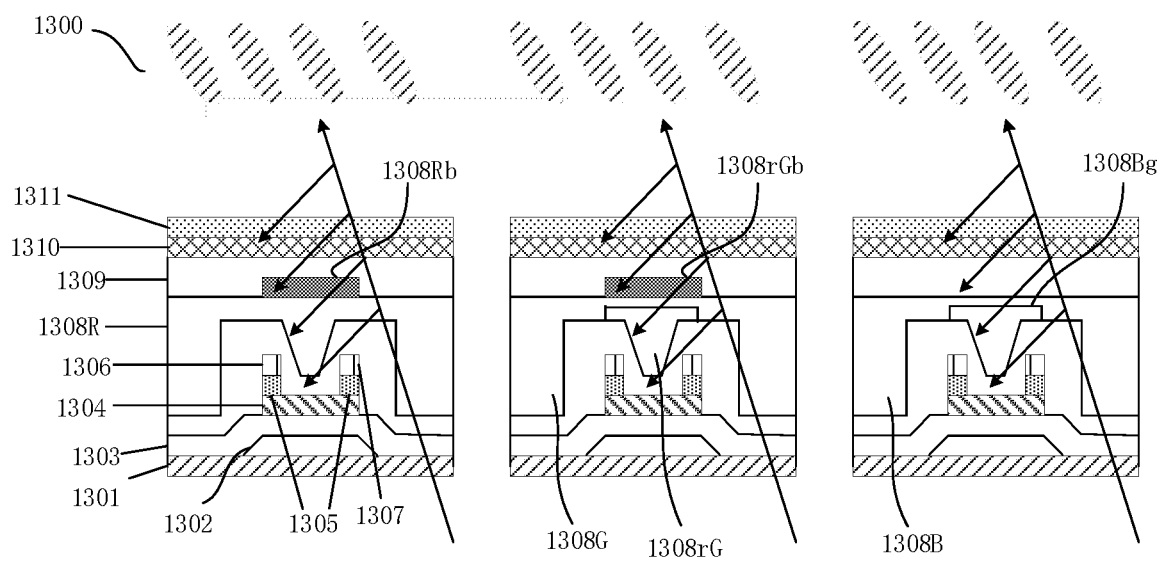
FIG. 13 is a schematic cross-sectional diagram of an array substrate corresponding to an R/G/B mask according to an embodiment of the present disclosure.
Figure 14:
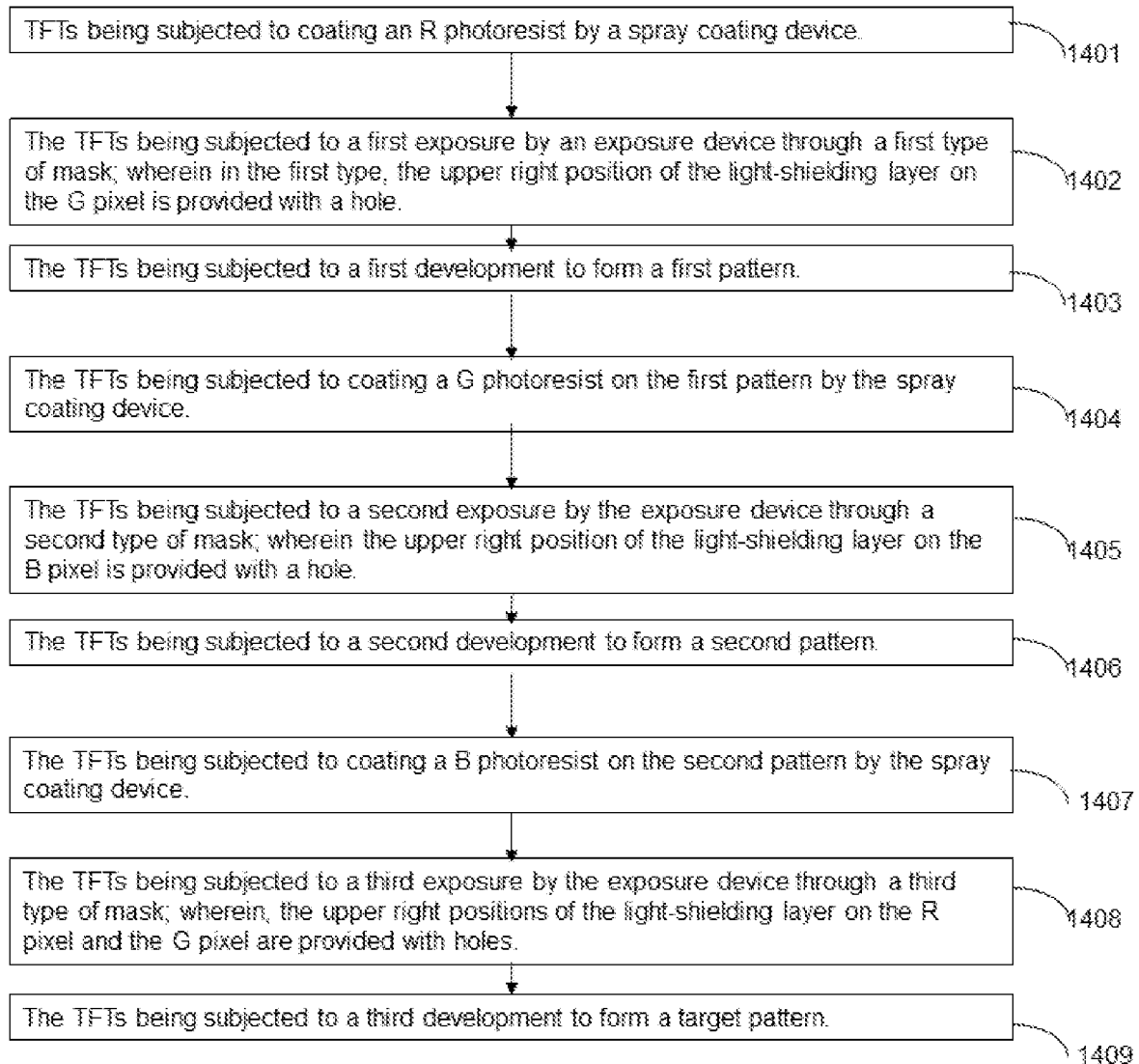
FIG. 14 is a flowchart of a manufacturing method of a TFT pattern by an R/G/B mask according to an embodiment of the present disclosure.

Further, referring from FIG. 12 to FIG. 14 in the following, FIG. 12 is a schematic top view of a R/G/B mask corresponding to pixel color blocks according to an embodiment of the present disclosure, FIG. 13 is a schematic cross-sectional diagram of an array substrate 1300 corresponding to the R/G/B mask according to an embodiment of the present disclosure, and FIG. 14 is a flowchart of a manufacturing method of a TFT pattern by the R/G/B mask according to an embodiment of the present disclosure.

Based on FIG. 12 and the description of the R/G/B mask, the cross-sectional diagram of the array substrate 1300 containing TFTs corresponding to the R/G/B mask in FIG. 13 can be manufactured by three consecutive exposures on each set of pixel color blocks at different time points. It should be noted that in the part of the cross-sectional view of the TFTs of the array substrate 1300 shown in FIG. 13, the left picture is a cross-sectional view of a TFT area under a red pixel, which corresponds to the mask type of the upper picture in FIG. 12. The middle picture is a cross-sectional view of a TFT area under a green pixel, which corresponds to the mask type of the middle picture in FIG. 12. The right picture is a cross-sectional view of a TFT area under a blue pixel, which corresponds to the mask type of the lower picture in FIG. 12. Wherein, the array substrate 1300 consists of a base substrate 1301, a gate electrode layer 1302, a first insulating layer 1303, a first semiconductor layer 1304

(an As layer), a second semiconductor layer 1305, a source electrode 1306, a drain electrode 1307, an R photoresist layer 1308R, a B photoresist layer 1308Rb, a planarization layer 1309, a pixel layer 1310, and an alignment layer 1311 marked in the left picture of FIG. 13 in sequence from bottom to top, and a TFT comprises the gate electrode layer 1302, the first insulating layer 1303, the first semiconductor layer 1304, the second semiconductor layer 1305, the source electrode 1306, and the drain electrode 1307. In addition, the pixel layer 1030 is electrically connected to the drain electrode of the TFT. Layers in the middle picture and the right picture corresponding to those in the left picture are the same as the left picture, which will not be iterated herein for the sake of conciseness, but 1308G in the middle picture refers to a G photoresist layer, 1308rG is an R photoresist layer covered by the G photoresist layer, and 1308rGb is a B photoresist layer covering the G photoresist layer. In the part of the cross-sectional view of the TFTs shown in FIG. 13, the left picture is a cross-sectional view of a TFT area under a red pixel, the middle picture is a cross-sectional view of a TFT area under a green pixel, and the right picture is a cross-sectional view of a TFT area under a blue pixel. There is a TFT area under each column of pixels.

It should be noted that although FIG. 13 of the embodiment shows the alignment layer 1311, the alignment layer 1311 can also not be disposed in the array substrate, which is not limited herein.

Referring to FIG. 14, the mask in the embodiment is described above (as shown in FIG. 12). An embodiment of the manufacturing method of the TFT pattern based on the R/G/B mask has following steps:

step 1401: TFTs being subjected to coating an R photoresist by a spray coating device.

Step 1402: the TFTs being subjected to a first exposure by an exposure device through a first type of mask; wherein in the first type, the upper right position of the light-shielding layer on the G pixel is provided with a hole.

In the embodiment, in pixel color blocks, the first type has no light-shielding layer on the R pixel and has a light-shielding layer on the G pixel and the B pixel, and the upper right position of the light-shielding layer on the G pixel is provided with a hole.

Step 1403: the TFTs being subjected to a first development to form a first pattern.

In the embodiment, after a TFT under the R pixel is subjected to the first development, a pattern of a layer of R photoresist will be formed on the TFT under the R pixel; because the upper right position of the light-shielding layer on the G pixel is provided with a hole, a pattern of a thinner layer of R photoresist will be formed on the TFT under the G pixel; and because there is a light-shielding layer on the B pixel, a pattern of R photoresist will not be formed under the B pixel.

That way, a photoresist pattern formed on the three TFTs under the three columns of pixels after the first exposure constitutes the first pattern.

Step 1404: the TFTs being subjected to coating a G photoresist on the first pattern by the spray coating device.

Step 1405: the TFTs being subjected to a second exposure by the exposure device through a second type of mask; wherein the upper right position of the light-shielding layer on the B pixel is provided with a hole.

In the embodiment, in pixel color blocks, the second type has no light-shielding layer on the G pixel and has a light-shielding layer on the R pixel and the B pixel, and the upper right position of the light-shielding layer on the B pixel is provided with the hole.

Step 1406: the TFTs being subjected to a second development to form a second pattern.

In the embodiment, after the TFT under the R pixel is subjected to the second development, a pattern of G photoresist will not be formed on the R photoresist on the TFT, a pattern of a layer of G photoresist will be formed on the R photoresist on the TFT under the G pixel, and a pattern of a layer of G photoresist will be formed on the TFT under the B pixel.

That way, a photoresist pattern formed on the three TFTs under the three columns of pixels after the second exposure constitutes the second pattern.

Step 1407: the TFTs being subjected to coating a B photoresist on the second pattern by the spray coating device.

Step 1408: the TFTs being subjected to a third exposure by the exposure device through a third type of mask; wherein, the upper right positions of the light-shielding layer on the R pixel and the G pixel are provided with holes.

In the embodiment, the third type has no light-shielding layer on the B pixel and has the light-shielding layer on the R pixel and the G pixel. The upper right positions of the light-shielding layer on the R pixel and the G pixel are provided with the holes.

Step 1409: the TFTs being subjected to a third development to form a target pattern.

In the embodiment, after the TFT under the R pixel is subjected to the third development, a pattern of a thinner layer of B photoresist will be formed on the pattern of the R photoresist on the TFT under the R pixel, a pattern of a thinner layer of B photoresist will be formed on the pattern of the G photoresist on the TFT under the G pixel, and a pattern of a layer of B photoresist will be formed on the pattern of the G photoresist on the TFT under the B pixel.

That way, a photoresist pattern formed on the three TFTs under the three columns of pixels after the third exposure constitutes the target pattern.

In the embodiment, because there are three layers of photoresists stacked on the TFTs under the B pixel after three times of exposures, the reflected light reflected to the semiconductor As layer of the TFT can be further counteracted, thereby further ensuring normal working of the TFTs.

Figure 15:
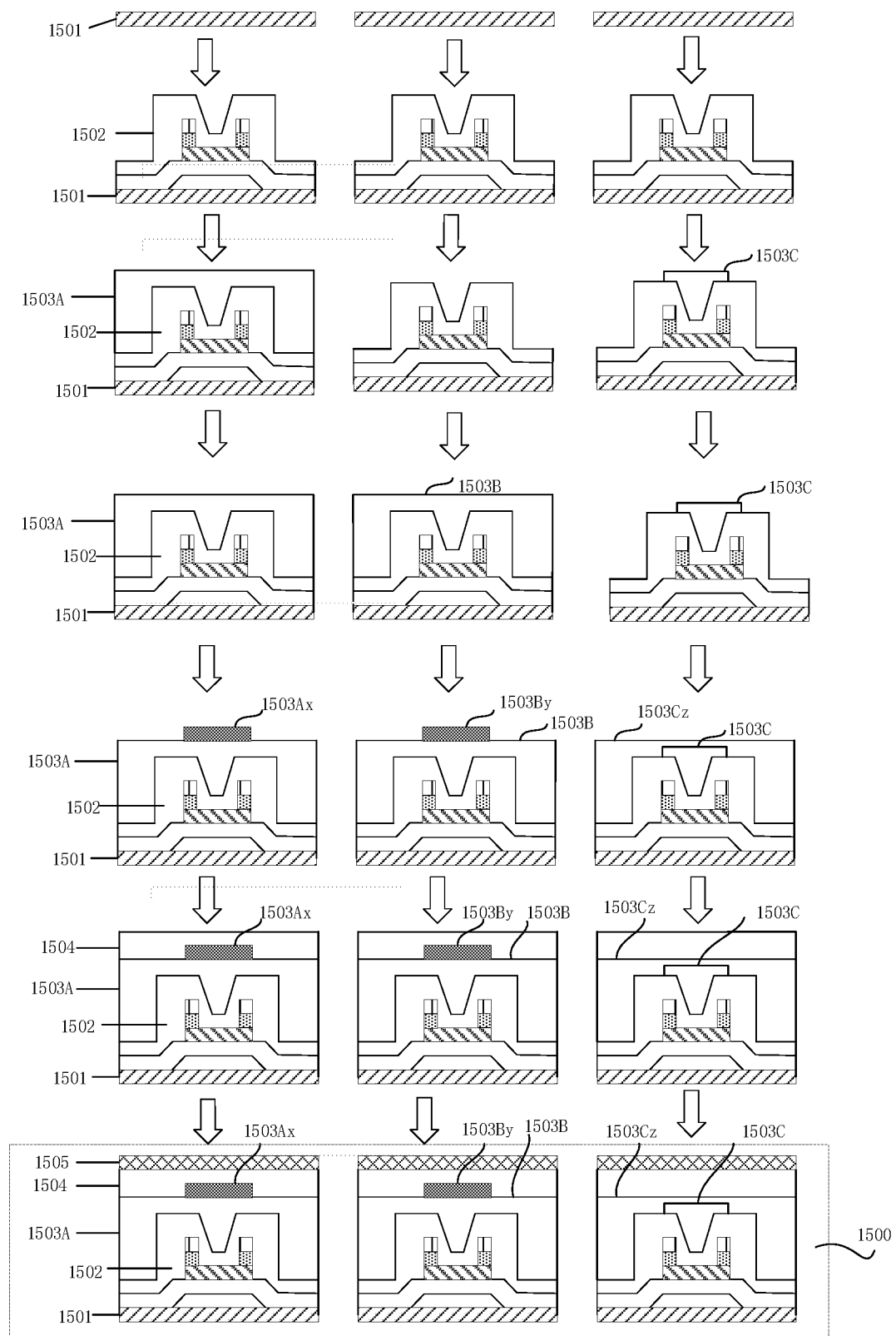
FIG. 15 is a schematic processing diagram of an array substrate according to an embodiment of the present disclosure.

The present disclosure further provides an array substrate according to an embodiment. Referring to FIG. 15, FIG. 15 is a schematic processing diagram of an array substrate according to an embodiment of the present disclosure.

An array substrate 1500 according to an embodiment of the present disclosure can be manufactured by a half-grayscale mask or a slit mask, which is not limited herein.

Specifically, a process of manufacturing the array substrate 1500 by the R/B mask etching process (including film forming, exposing, developing, and etching) comprises:

A first step: forming TFTs 1502 on a base substrate 1501. Wherein, each sub-pixel color block covers a TFT 1502, and each set of pixel color blocks can comprise three sub-pixels of R, G, and B. That way, each set of pixel color blocks can cover three TFTs 1502, but each set of pixel color blocks can also comprise more different sub-pixels, such as a white sub-pixel, which is not limited herein.

A second step: coating a first photoresist on the TFTs 1502.

In the embodiment, the first photoresist can be coated on each set of sub-pixels R, G, and B. In the embodiment, the first photoresist is an R photoresist.

A third step: the first photoresist on the TFTs 1502 is subjected to a first exposure by a first type of an R/B mask.

The R/B mask used in the embodiment consists of corresponding three types subjected to exposures by an exposure device at adjacent different time points. Wherein, in two types of the three types, two columns of the light-shielding layer of the sub-pixels are provided with holes, and positions of the holes correspond to positions of the TFTs 1502. The R/B mask used in the first exposure is the first type, the first type has no light-shielding layer on R pixels and has a light-shielding layer on G pixels and B pixels, and the light-shielding layer corresponding to upper right positions of the B pixels is provided with holes.

A fourth step: performing a first development on the TFTs 1502 to form a first pattern on the TFTs 1502.

The first pattern comprises 1503A, 1503C, and no patterns on the TFTs corresponding to the G pixels. Wherein, an R photoresist 1503A is formed on the TFTs corresponding to the R pixels, and an R photoresist 1503C is formed on the TFTs corresponding to the B pixels.

A fifth step: coating a second photoresist on the first pattern of the TFTs 1502.

In the embodiment, the second photoresist is a G photoresist. That is coating the G photoresist on 1503A, 1503C, and the R photoresist on the TFTs of the G pixels.

A sixth step: performing a second exposure on the first pattern 1503A, 1503C, and the second photoresist on the first photoresist on the TFTs corresponding to the G pixels.

The second type has no light-shielding layer on the G pixels and has the light-shielding layer on the R pixels and the B pixels.

A seventh step: performing a second development on the TFTs 1502 to form a second pattern on the first pattern of TFTs 1502.

The second pattern comprises 1503B formed by the G photoresist, 1503B corresponds to the TFTs of the G pixels, and the second pattern consists of 1503A, 1503B, and 1503C because there is no patterns formed on 1503A and 1503C.

An eighth step: coating a third photoresist on the second pattern 1503A, 1503B, and 1503C of TFTs 1502.

In the embodiment, the third photoresist is a B photoresist.

A ninth step: performing a third exposure on the second pattern 1503A, 1503B, and 1503C by the third type of mask.

The third type has no light-shielding layer on the B pixels and has a light-shielding layer on the R pixels and the G pixels, and upper right positions of the light-shielding layer on the R pixels and the G pixels are provided with holes.

A tenth step: performing a third development on the TFTs 1502 to form a target pattern on the TFTs 1502.

In the embodiment, the target pattern is formed on the TFTs 1502 by the third development, and the target pattern comprises 1503Ax, 1503By, and 1503Cz. That is, a B photoresist 1503Ax is formed on 1503A of the R pixels of the second pattern, a B photoresist 1503By is formed on 1503B of the G pixels, and a B photoresist 1503Cz is formed on 1503C of the B pixels.

It should be noted that 1503Ax, 1503By, 1503Cz of the target pattern constitute a photoresist layer 1503.

An eleventh step: forming a pixel layer 1504 on the photoresist layer 1503.

In the embodiment, 1503Ax, 1503By, 1503Cz of the target pattern constitute the photoresist layer 1503, so the pixel layer 1504 is formed on the photoresist layer 1503.

A twelfth step: forming an alignment layer 1505 on the pixel layer 1504.

It should be noted that in the embodiment, the alignment layer 1505 can be formed on the array substrate 1500 or not, which is not limited herein.

Thus, the array substrate 1500 in the embodiment of the present disclosure is formed by the above steps.

It should be noted that in the embodiment of the present disclosure, not only the R/B mask, but also the aforementioned G/B mask and R/G mask can be used. A pattern having two stacked color photoresists can be formed on the TFTs 1502 by using any one of the three masks. Further, The R/G/B mask can also be used in the embodiment of the present disclosure, and a pattern having three stacked color photoresists can be formed on the TFTs 1502 by using the mask. The foregoing embodiments shown in FIGS. 12 to 14 have been specifically described, and are not repeated here.

In the embodiment, a pattern having two or more layers of photoresists can be formed on the array substrate 1500 by a half-grayscale mask or a slit mask which can change into different types at different time points. Due to two or more stacked photoresists on the array substrate 1500 acting as a matting effect against reflected light, the reflected light is almost completely counteracted, thereby the electrical performances of the TFTs would not be affected and normal working of the TFTs can be ensured.

In the above description, details are set forth for the purpose of explanation. It should be understood by one of ordinary skill in the art that the present disclosure may be implemented without use of these specific details. In other embodiments, well-known structures and procedures are not described in detail to avoid obscuring the description of the present disclosure with unnecessary details. Accordingly, the present disclosure is not intended to be limited to the embodiments shown, but is to be accorded the widest scope consistent with the principles and features disclosed herein.

Although the present disclosure has been shown and described with respect to one or more embodiments, those skilled in the art will recognize equivalent variations and modifications upon reading and understanding the present specification and drawings. The present disclosure includes all such modifications and alterations, and is limited only by the scope of the appended claims. In particular, with regard to the various functions performed by the aforementioned components, the terminology used to describe such components is intended to correspond to any component (unless otherwise indicated) that performs the specified function of the component (eg, it is functionally equivalent), even if it is not structurally equivalent to the disclosed structure that performs the functions in the exemplary embodiments of the present disclosure shown herein.

That is, the above are only examples of the present disclosure, and thus do not limit the patent scope of the present disclosure. Any equivalent structure or equivalent process transformation made using the contents of the specification and drawings of the present disclosure, such as mutual combinations of technical features between the embodiments, or direct or indirect use in other related technical fields, is similarly included in the patent protection scope of this application.

In addition, in the description of the present disclosure, it should be understood that terms such as "on", "under", "upper", "lower", "upper right", as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure. In addition, for structural elements with the same or similar characteristics, the present disclosure may be identified by the same or different reference numerals. In addition, terms such as "first" and "second" are used herein for purposes of description and are not intended to indicate or imply relative importance or implicitly indicating the number of technical features indicated. Thus, features limited by "first" and "second" are intended to indicate or imply including one or more than one these features. In the description of the present disclosure, "a plurality of" relates to two or more than two, unless otherwise specified.

In order to enable any person skilled in the art to implement and use the present disclosure, the description is given as above. In the above description, details are set forth for the purpose of explanation. It should be understood by one of ordinary skill in the art that the present disclosure may be implemented without use of these specific details. In other embodiments, well-known structures and procedures are not described in detail to avoid obscuring the description of the present disclosure with unnecessary details. Accordingly, the present disclosure is not intended to be limited to the embodiments shown, but is to be accorded the widest scope consistent with the principles and features disclosed herein.

What is claimed is:

1. A manufacturing method of a thin film transistor (TFT) pattern, comprising:
    coating a first photoresist on TFTs by a spray coating device;
    performing a first exposure on the TFTs by an exposure device by covering a first type of mask on the TFTs; wherein the first type of mask has no light-shielding layer on a first column of sub-pixels and has the light-shielding layer on a second column of sub-pixels and a third column of sub-pixels, the first column of sub-pixels, the second column of sub-pixels, and the third column of sub-pixels constitute a set of pixel color blocks, and a mask consists of the first type of mask, a second type of mask, and a third type of mask and is used for exposure by the exposure device at adjacent different time points;
    performing a first development on the TFTs to form a first pattern;
    coating a second photoresist on the first pattern by the spray coating device;
    performing a second exposure on the TFTs by the exposure device through the second type of mask; wherein the second type of mask has no light-shielding layer on the second column of sub-pixels and has the light-shielding layer on the first column of sub-pixels and the third column of sub-pixels;
    performing a second development on the TFTs to form a second pattern;
    coating a third photoresist on the second pattern by the spray coating device;
    performing a third exposure on the TFTs by the exposure device through the third type of mask; wherein the third type of mask has no light-shielding layer on the third column of sub-pixels and has the light-shielding layer on the first column of sub-pixels and the second column of sub-pixels; and
    performing a third development on the TFTs to form a target pattern; wherein in any two types of masks, in two columns of the light-shielding layer on the sub-pixels, at least one column of the light-shielding layer on the sub-pixels is provided with a hole, and a position of the hole corresponds to a position of the TFTs.

2. The method according to claim 1, wherein in any two types of masks, in the two columns of the light-shielding layer on the sub-pixels, the at least one column of the light-shielding layer on the sub-pixels provided with the hole further refers to:
    in the two columns of the light-shielding layer on the sub-pixels of each of the three types of masks, at least one column of the light-shielding layer on the sub-pixels is provided with the hole.

3. The method according to claim 1, wherein the hole is defined on the light-shielding layer and corresponds to an upper right position of the sub-pixels.

4. The method according to claim 1, wherein the first photoresist, the second photoresist, and the third photoresist are a red photoresist, a green photoresist, and a blue photoresist, respectively.

5. The method according to claim 1, wherein the first column of sub-pixels, the second column of sub-pixels, and the third column of sub-pixels are red pixels, green pixels, and blue pixels, respectively.

6. An array substrate, comprising:
    a base substrate;
    a plurality of thin film transistors (TFTs) disposed on the base substrate and comprising a gate electrode and a drain electrode;
    a photoresist layer covering the TFTs, wherein the photoresist layer consists of at least two different colors of photoresist layers;
    a pixel layer covering the photoresist layer and electrically connected to the drain electrode of the TFTs; and
    an alignment layer covering the pixel layer.

7. The array substrate according to claim 6, wherein in red sub-pixels of the array substrate, the photoresist layer comprises a red photoresist layer and a blue photoresist layer disposed on the red photoresist layer; in green sub-pixels of the array substrate, the photoresist layer comprises a green photoresist layer and a blue photoresist layer disposed on the green photoresist layer; and in blue sub-pixels of the array substrate, the photoresist layer comprises a blue photoresist layer and a green photoresist layer disposed on the blue photoresist layer.

8. The array substrate according to claim 6, wherein in red sub-pixels of the array substrate, the photoresist layer comprises a red photoresist layer and a green photoresist layer disposed on the red photoresist layer; in green sub-pixels of the array substrate, the photoresist layer comprises a green photoresist layer and a red photoresist layer disposed on the green photoresist layer; and in blue sub-pixels of the array substrate, the photoresist layer comprises a blue photoresist layer and a green photoresist layer disposed on the blue photoresist layer.

9. The array substrate according to claim 6, wherein in red sub-pixels of the array substrate, the photoresist layer comprises a red photoresist layer and a blue photoresist layer disposed on the red photoresist layer; in green sub-pixels of the array substrate, the photoresist layer comprises a red photoresist layer, a green photoresist layer disposed on the red photoresist layer, and a blue photoresist layer disposed on the green photoresist layer; and in blue sub-pixels of the array substrate, the photoresist layer comprises a blue photoresist layer and a green photoresist layer disposed on the blue photoresist layer.

10. A mask, consisting of corresponding three types subjected to exposures by an exposure device at adjacent different time points, wherein the three types are respectively:

a first type having no light-shielding layer on a first column of sub-pixels and having the light-shielding layer on a second column of sub-pixels and a third column of sub-pixels when thin film transistors (TFTs) being subjected to a first exposure by the exposure device through the first type of the mask; wherein the first column of sub-pixels, the second column of sub-pixels, and the third column of sub-pixels constitute a set of pixel color blocks;

a second type having no light-shielding layer on the second column of sub-pixels and having the light-shielding layer on the first column of sub-pixels and the third column of sub-pixels when the TFTs being subjected to a second exposure by the exposure device through the second type of the mask; and a third type having no light-shielding layer on the third column of sub-pixels and having the light-shielding layer on the first column of sub-pixels and the second column of sub-pixels when the TFTs being subjected to a third exposure by the exposure device through the third type of the mask; wherein in two columns of the light-shielding layer on the sub-pixels of two types among the three types of the mask, at least one column of the light-shielding layer on the sub-pixels is provided with a hole, and a position of the hole corresponds to a position of the TFTs; wherein the TFTs are TFT areas on a substrate of a thin film transistor liquid crystal display (TFT-LCD) and the TFTs are covered with the mask.

11. The mask according to claim 10, wherein in the two columns of the light-shielding layer on the sub-pixels of the two types among the three types of the mask, the at least one column of the light-shielding layer on the sub-pixels provided with the hole further refers to:

in the two columns of the light-shielding layer on the sub-pixels of each of the three types, at least one column of the light-shielding layer on the sub-pixels is provided with the hole.

12. The mask according to claim 11, wherein the hole is defined on the light-shielding layer and corresponds to an upper right position of the sub-pixels.

* * * * *